(12) United States Patent
Feng

(10) Patent No.: US 8,219,846 B2
(45) Date of Patent: Jul. 10, 2012

(54) CIRCUIT FOR AND METHOD OF RECEIVING VIDEO DATA

(75) Inventor: Yi Feng, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 896 days.

(21) Appl. No.: 12/124,019

(22) Filed: May 20, 2008

(65) Prior Publication Data

US 2009/0290071 A1 Nov. 26, 2009

(51) Int. Cl.
*G06F 1/12* (2006.01)
*G06F 1/00* (2006.01)
*G06F 11/00* (2006.01)
*G06T 1/00* (2006.01)

(52) U.S. Cl. ......... 713/503; 713/400; 713/500; 345/418

(58) Field of Classification Search .................. 713/400, 713/500, 503; 345/418
See application file for complete search history.

(56) References Cited

U.S. PATENT DOCUMENTS

| | | | |
|---|---|---|---|
| 4,486,739 A | 12/1984 | Franaszek et al. | |
| 5,974,464 A | 10/1999 | Shin et al. | |
| 6,018,305 A * | 1/2000 | Kikuchi et al. | 341/100 |
| 6,374,361 B1 | 4/2002 | Lee et al. | |
| 6,815,985 B2 * | 11/2004 | Jeon | 327/115 |
| 7,230,460 B1 | 6/2007 | Wan et al. | |
| 7,440,702 B2 * | 10/2008 | Imai | 398/141 |
| 2002/0075845 A1 * | 6/2002 | Mullaney et al. | 370/351 |
| 2004/0155690 A1 | 8/2004 | Andrews et al. | |
| 2005/0027893 A1 * | 2/2005 | Jung et al. | 710/1 |
| 2005/0195894 A1 * | 9/2005 | Kim et al. | 375/232 |

FOREIGN PATENT DOCUMENTS

EP 1 313 257 A1 5/2003

OTHER PUBLICATIONS

Texas Instruments, "TFP401, TFP401A TI PanelBus Digital Receiver," Data Sheet SLDS120B, Mar. 2000, pp. 1-20, available from Texas Instruments, P.O. Box 655303, Dallas, Texas, 75265.
Digital Display Working Group, "Digital Visual Interface DVI Revision 1.0," Apr. 2, 1999, pp. 1-76, available at http://www.ddwg.org/lib/dvi_10.pdf.
HDMI Licensing, LLC, "High-Definition Multimedia Interface Specification Version 1.3a," Nov. 10, 2006, pp. 1-276, available at http://www.hdmi.org/download/HDMISpecification13a.pdf.
Consumer Electronics Association, "CEA Standard, A DTV Profile for Uncompressed High Speed Digital Interfaces," Specification CEA-861-D, Jul. 2006, pp. 1-176, available from Consumer Electronics Association 2006, Technology & Standards Department, 2500 Wilson Blvd., Arlington, VA 22201.

(Continued)

*Primary Examiner* — Ji H Bae
(74) *Attorney, Agent, or Firm* — John J. King

(57) ABSTRACT

A circuit of an integrated circuit for receiving video data having a plurality of data streams of pixel data and a pixel clock is disclosed. The circuit comprises a plurality of data recovery circuits, each data recovery circuit coupled to receive a corresponding data stream of the plurality of data streams and having a phase shifter generating a clock signal used to receive the data stream; and a channel deskew circuit coupled to receive the output of each data recovery circuit and the pixel clock. A method of receiving video data is also disclosed.

18 Claims, 6 Drawing Sheets

OTHER PUBLICATIONS

Xilinx, Inc., "Spartan-3A FPGA Family: Data Sheet," Data Sheet DS529, Apr. 15, 2008, pp. 1-133, available from Xilinx, Inc., 2100 Logic Drive, San Jose, CA 95124.

Xilinx, Inc., "Spartan-3E Display Development Kit," Product Brief, copyright 2007, available from Xilinx, Inc., 2100 Logic Drive, San Jose, CA 95124 or http://www.xilinx.com/bvdocs/ipcenter/product_brief/S3E_Display_DK_PB.pdf.

Sawyer, Nick, "Data Recovery," Application Note ZAPP224 (v2.5), Jul. 11, 2005, pp. 1-7, available from Xilinx, Inc., 2100 Logic Drive, San Jose, CA 95124.

Snow, John F., "Efficient 8X Oversampling Asynchronous Serial Data Recovery Using IDELAY," Application Note XAPP861 (v1.1), Jul. 20, 2007, pp. 1-11, available from Xilinx, Inc., 2100 Logic Drive, San Jose, CA 95124.

* cited by examiner

CIRCUIT FOR AND METHOD OF RECEIVING VIDEO DATA

FIELD OF THE INVENTION

The present invention relates generally to integrated circuits, and in particular, to a circuit for and a method of receiving video data.

BACKGROUND OF THE INVENTION

Receptors in the human eye are only capable of detecting light having wavelengths from 400 nm to 700 nm. These receptors are called cones and are of three different types, including one for red light, one for green light and one for blue light. If a single wavelength of light is observed, the relative responses of these three receptors allow us to discern what we call the color of the light. This phenomenon is extremely useful because it enables generating a range of colors by simply adding together various proportions of light from just three different wavelengths. The process, known as additive color matching, is utilized in color television systems. A resulting image to be displayed is broken down into an array of picture elements or pixels to be displayed.

Generally, each pixel displays a proportion of red, green or blue depending on the signals driven to the display. The representation of an image in red, blue and green is commonly referred to as RBG. However, transmitting or storing these RBG color components requires significant bandwidth. Accordingly, luminance and color difference coding is often used to reduce the bandwidth of an image to be displayed. For example, the YUV format contains a Y portion representing a luminance component (also known as Luma) associated with brightness, and U and V portions representing chrominance components (also known as Chroma 1 and Chroma 2) associated with color. In addition to reducing bandwidth, the YUV format models human perception of color more closely than the standard RBG format. While video data may be transmitted in various formats having different components, receiving video data may pose problems and require circuits which consume area of the integrated circuit.

SUMMARY OF THE INVENTION

A circuit of an integrated circuit for receiving video data having a plurality of data streams of pixel data and a pixel clock is disclosed. The circuit comprises a plurality of data recovery circuits, each data recovery circuit coupled to receive a corresponding data stream of the plurality of data streams and having a phase shifter generating a clock signal used to receive the data stream; and a channel deskew circuit coupled to receive the output of each data recovery circuit and the pixel clock.

According to an alternate embodiment, a circuit of an integrated circuit for receiving video data having a plurality of data streams of pixel data and a pixel clock comprises a first data recovery circuit having a first phase shifter, the first data recovery circuit receiving signals associated with a red component of the video data; a second data recovery circuit having a second phase shifter, the second data recovery circuit receiving signals associated with a green component of the video data; a third data recovery circuit having a third phase shifter, the third data recovery circuit receiving signals associated with a blue component of the video data; and a channel deskew circuit coupled to receive the output of each of the first, second and third data receiving circuits and the pixel clock.

A method of receiving video data having a plurality of data streams of pixel data and a pixel clock is also disclosed. The method comprises receiving a plurality of components of the video data at a corresponding plurality of data recovery circuits, each data recovery circuit having a phase shifter; separately adjusting the phase of each component of video data received at the plurality of data recovery circuits; and deskewing the output of each data receiving circuit.

DETAILED DESCRIPTION

Figure 1:
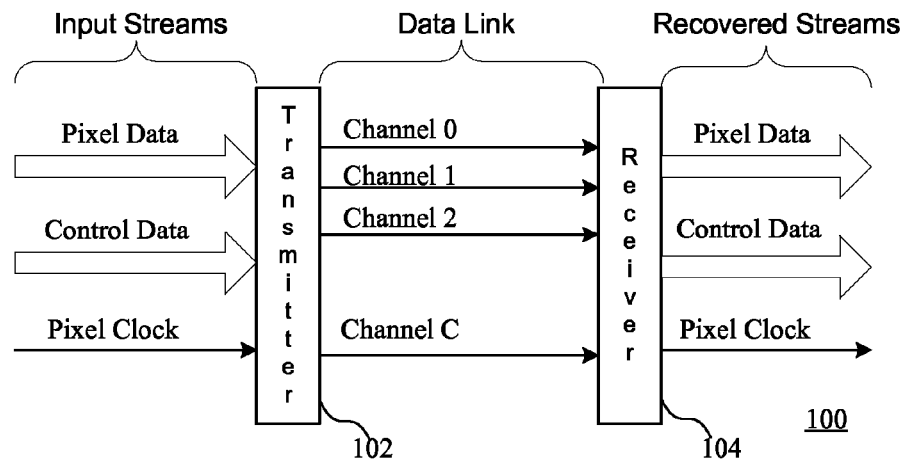
FIG. 1 is a block diagram of a system for transmitting video data according to an embodiment the present invention.

Turning first to FIG. 1, a block diagram 100 of a system for transmitting video data according to an embodiment the present invention is shown. Video data may be transmitted according to a number of industry-defined standards. The Transition Minimized Differential Signaling (TMDS) standard is a signaling standard used for video data transmission over a Digital Visual Interface (DVI) or a High Definition Multimedia Interface (HDMI) found widely in the latest consumer electronics devices such as flat panel TVs, PC monitors, DVD players and video game consoles. There are four channels of serial data generated by a transmitter 102 used to establish a single link in DVI or HDMI video transmission. Three of them are designated for components of pixel data such as red, green and blue color components for each video pixel data. The fourth channel is designated for transmitting a clock toggling at the pixel data rate. Each color component originates as 8-bit data and is then converted into a 10-bit symbol through an 8 B/10 B encoding scheme. 8 B/10 B encoding is well known in the art and is described for example in U.S. Pat. No. 4,486,739 to Franaszek, the entire patent of which is incorporated by reference. The 10-bit symbol is then serialized and transmitted on the TMDS data channels of the data link. This 10:1 serialization ratio leads to a 10× faster bit rate than the actual pixel rate. A receive 104 then generates the received data streams, as will be described in more detail below.

Figure 2:
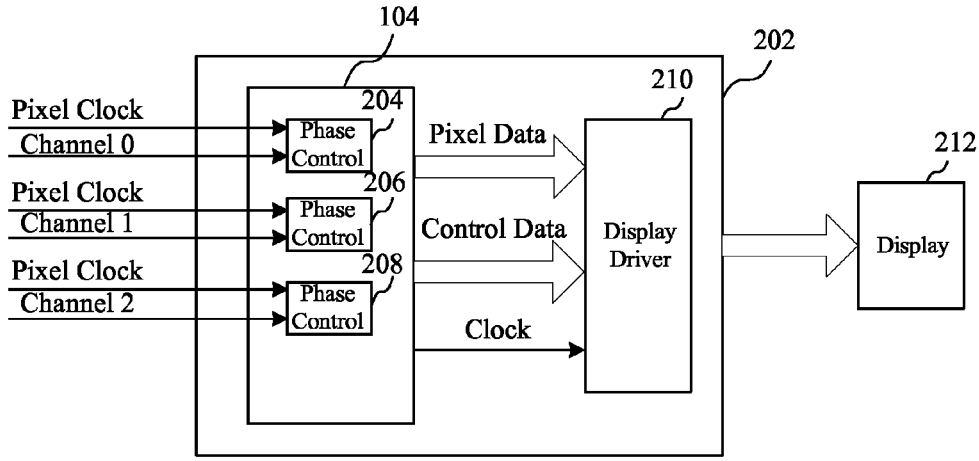
FIG. 2 is a block diagram of a circuit for displaying video data according to an embodiment of the present invention.

Turning now to FIG. 2, a block diagram of a circuit for displaying video data according to an embodiment of the present invention is shown. According to the embodiment of FIG. 2, an integrated circuit 202 comprises the receiver 104. As will be described in more detail below, the integrated circuit 202 may be a programmable logic device, an application specific integrated circuit (ASIC), or any other type of integrated circuit which may include circuitry to receive video data. As shown, multiple phase control circuits 204, 206 and 208 are implemented to receive different portions of a video data stream, where each phase control circuit receives a different portion of the video data and the pixel clock. The receiver 104 then generates the pixel data, the control data and a clock signal to a display driver 210 which is used to drive the display 212.

Figure 3:
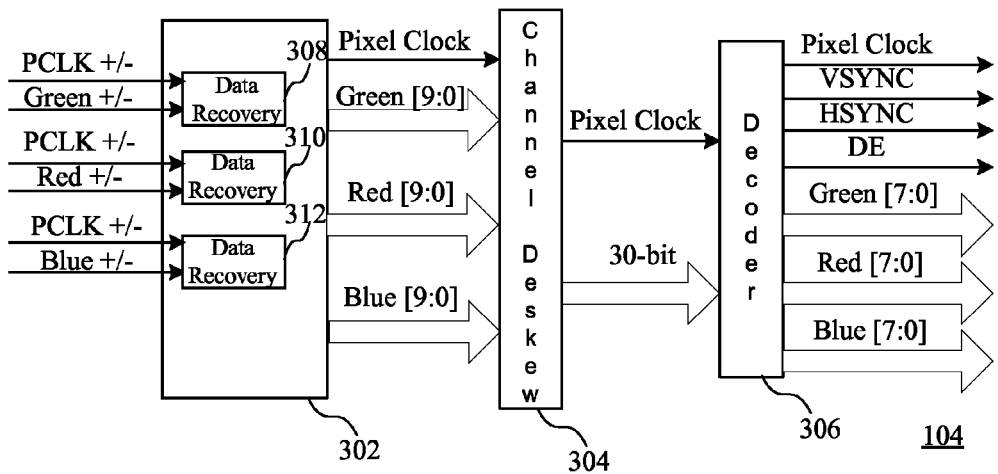
FIG. 3 is a block diagram of a circuit for receiving RBG video data according to an embodiment of the present invention.

Turning now to FIG. 3, block diagram of a system for receiving RBG video data according to an embodiment of the present invention is shown. The embodiment of FIG. 3 is implemented according to the embodiment of FIG. 2, but specifically shows red, blue and green data coupled to separate data recovery circuits, where the received data is also deskewed and decoded. In particular, a data circuit 302 receives the differential input data for the different color components of the pixels, and outputs the data along with a pixel clock to a channel deskew circuit 304. The deskewed data is then decoded by a decoder 306. The data circuit 302 comprises data recovery circuits 308, 310 and 312 for receiving the red, blue and green components of each of the pixels and the pixel clock. As will be described in more detail in FIGS. 4-7, the data will be recovered in each channel as 10 bit data, and then deskewed by the channel deskew circuit 304. Finally, the decoder, such as an 8 B/10 B decoder, will generate the original 8-bit pixel data, as well as various control data.

During the video frame transmission, an active pixel symbol is periodically interlaced with four distinct control tokens representing blanking intervals. These control tokens not only provide accurate video line scan (HSYNC) and frame update (VSYNC) information, but also serve the purpose of word boundary synchronization. A receiver typically needs to recover the bit clock using the incoming pixel clock, and then apply the bit clock to recover the serial data stream in a process known as clock and data recovery (CDR). After separately receiving data of the individual channels, channel deskew must be performed to remove skew between the three data channels. The skew represents variations in the phase of different signals in a circuit which may be caused by a number of factors, such as different path lengths for the signals. After channel de-skewing and decoding, the final 24-bit color components and the video timing information is generated. The video timing information may include HSYNC and VSYNC signals to regenerate the blanking intervals. The full video data receiving process is then completed.

Figure 4:
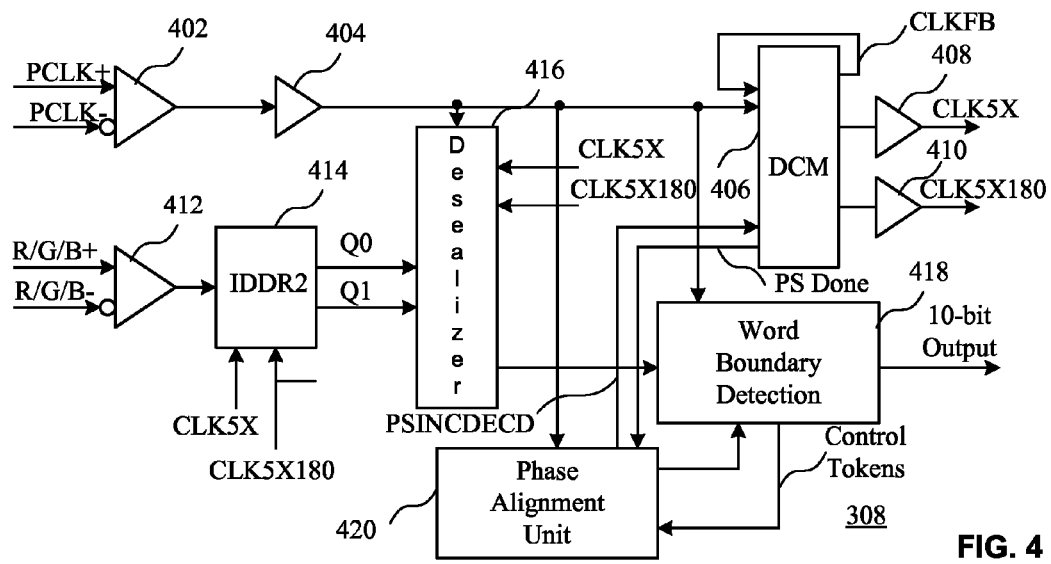
FIG. 4 is a block diagram of a data recovery circuit of FIG. 3 according to an embodiment of the present invention.

Turning now to FIG. 4, a block diagram of a data recovery circuit according to an embodiment of the present invention is shown. In particular, a pixel clock buffer 402 is coupled to receive a differential pixel clock signal, the output of which is coupled to a global clock buffer 404. A digital clock manager 406 is coupled to receive the pixel clock and generate a clock which is a multiple of the pixel clock. An example of a digital clock manager having a delay-locked loop (DLL) will be described in detail in reference to FIG. 6. In the embodiment of FIG. 4, a five times multiple clock signal (CLK5×) of the pixel clock is output by a buffer 408, while a 180 degree phase shifted clock signal (CLK5×180) of CLK5× is output by a buffer 410. A differential input data signal (R/G/B) having one of the red, green or blue components is coupled to an input data buffer 412, the output of which is coupled to an input double data rate (IDDR2) block 414. The IDDR2 receives data using the two clock signals and generates outputs Q0 and Q1 at a rate of ten times the pixel clock. That is, rather than generating a clock signal having a rate of ten times the pixel clock, a clock signal at five times the pixel clock rate and the inverted clock signal may be used to output the data at a rate of ten times the pixel clock rate. The fabric logic is effectively divided into two clock domains including the CLK5× and the pixel clock. The IDDR2 register provides an alignment feature which allows synchronization of the CLK5×180 sampled data into the CLK5× domain. Thus the de-serializer logic only receives data in the CLK5× domain. A de-serializer 416, also coupled to receive the CLK5× and CLK5×180 clock signals, is used to received a serialized data word, and de-serialize the data word to generate a 10-bit word. The CLK5× is needed only to drive the 1:10 de-serializer, while everything else is driven by the pixel clock. Accordingly, the timing slack is increased, making the implementation achievable in the FPGA. For example, a set of distributed RAMs may be used in the de-serializer as a dual port FIFO to enable the data to cross from the CLK5× domain back to the pixel clock domain. A word boundary detection circuit 418 is used to detect control tokens. The word boundary detection circuit may comprise a comparator to compare incoming data to a known control token to determine whether a required number of control tokens is received. The detection of control tokens is used by a phase alignment unit 420 to enable adjusting the phase of the CLK5× and CLK5×180 clock signals to ensure that the data is read properly in the eye of the valid data period, as will be described in more detail below.

Figure 5:
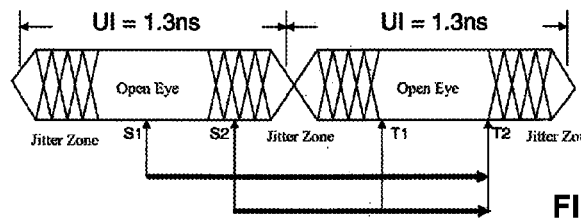
FIG. 5 is a diagram showing an open eye portion of a valid data period for receiving data according to the embodiment of FIG. 4.

While the pixel clock channel carries a character rate frequency reference from which the receiver reproduces a bit rate sample clock, such as CLK5×, for the incoming serial streams, the reproduced bit rate clock does not have a guaranteed phase relationship associated with any of the three data channels. Consequently the phase of the bit rate clock must be adjusted individually for each data channel in order to correctly sample the incoming serial data. As shown in the diagram of FIG. 5, an open eye shows a valid time for receiving data. The unit interval (UI), also referred as Bit Time ($T_{bit}$), is by definition only ⅒ of a pixel period, which can be derived from the pixel rate frequency defined by a specific video timing format. The CEA-861-D standard defined by Consumer Electronics Association specifies the video timing formats for high definition television (HDTV). For both the 720 p (1280×720 at 60 HZ progressive) and the 1080i (1920× 1080 at 60 HZ interlaced) standards, the pixel clock frequency is defined as 74.25 MHz. The corresponding serial data rate is 742.5 megabits per second (Mbps) where the UI is approximately 1.3 ns.

The transmitted serial data is received by differential pairs where the data sampling window is described as an "eye". The phase alignment for each received data channel requires adjusting the clock phase into the middle of the eye. In a digital transmission system, there exist transition uncertainties on both clock and data edges. The uncertainties are often referred to as jitter which effectively reduces the actual sampling margin, leading to a width of the eye which is typically shorter than the UI. Both the DVI and HDMI specifications require a compliant receiver to tolerate clock and data jitter up to 0.3 $T_{bit}$. For HD video, the sampling window is therefore reduced to 1300 ps×(1−2×0.3)=520 ps. In addition, skew between all three data channels is common. The DVI and HDMI specifications require the compliant receiver to tolerate skew of up to 0.6 $T_{pixel}$. Thus, the key to recover video data from a TMDS transmitter is to successfully adjust the reproduced bit rate clock into the middle of the 520 ps data eye on a per-channel basis, and then remove skew across all three data channels. The digital clock manager 406 and phase alignment unit 420 enabling adjusting the reproduced bit rate clock will be described in more detail in reference to FIGS. 6 and 7, respectively.

Figure 6:
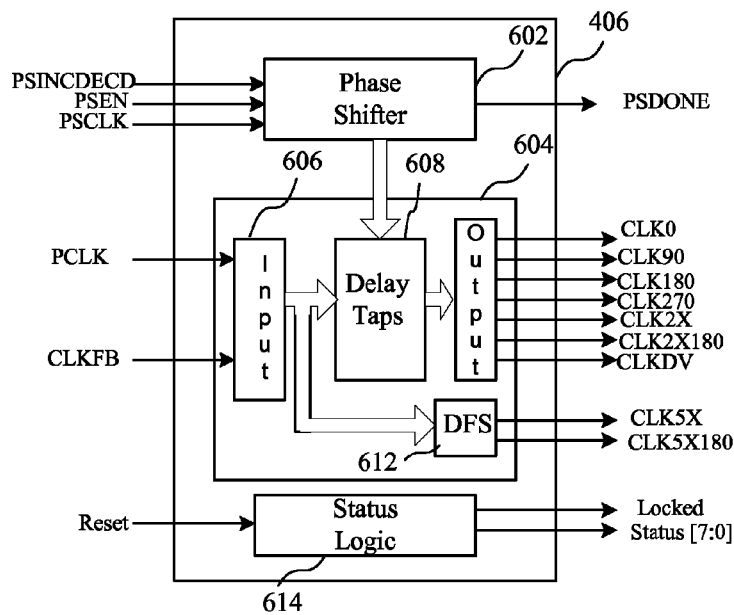
FIG. 6 is a block diagram of the digital clock manager of the circuit of FIG. 4 according to an embodiment of the present invention.

Turning now to FIG. 6, a block diagram of a digital clock manager according to an embodiment of the present invention is shown. The digital clock manager may comprise an on-chip digital de-skew circuit that generates zero-propagation-delay clock output signals. The de-skew circuit compensates for the delay on a routing network, and in this case ensures that the bit rate clock for reading data is on the center of the eye for a valid data period. In particular, the DCM 406 of FIG. 6 comprises a DLL having a phase shifter 602 coupled to receive a phase shift increment/decrement (PSINCDEC) signal, a phase shift enable (PSEN) and a phase shift clock (PSCLK), and generating a phase shift done (PSDONE) signal. The phase shifter unit controls the phase relations of the DCM's clock outputs to the CLKIN input. The DLL effectively eliminates the delay from the external clock input port to the individual clock loads within the device. The phase shifter shifts the phase of all nine DCM clock output signals generated by clock generator 604 by a fixed fraction of the input clock period. The fixed phase shift value is set at design time and loaded into the DCM, such as during the configuration of an FPGA. For example, the phase shifter may provide a digital interface for the FPGA application to dynamically advance or retard the current shift value by $1/256$th of the clock period.

The clock generator 604 has an input stage 606 coupled to receive the pixel clock and a feedback clock (CLKFB). The phase shifter 602 controls the delay taps 608 to generate a phase-shifted clock signal which enables reading data at the center of the open eye. The delay taps may comprises a predetermined number of selectable delay elements coupled in series, where an output of a given delay element may be selected to generate a signal at an appropriate phase. A digital frequency synthesizer (DFS) may be used to generate a multiple of the pixel clock, such as CLK5× and CLK5×180. The DFS provides a wide and flexible range of output frequencies based on the ratio of two user-defined integers comprising a multiplier and a divisor. The output frequency is derived from the input clock (PCLK) by simultaneous frequency division and multiplication, where the DLL provides the correct phase relationship between the PCLK and the DFS outputs.

Finally, a status logic circuit 614 is coupled to receive a reset signal and indicate the current state of the DCM via the Locked and Status output signals. The Locked output signal indicates whether the DCM outputs are in phase with the pixel clock input. The Status output signals indicate the state of the DLL and phase shift operations. The reset input signal resets the DCM logic and returns it to its post-configuration state. The reset signal forces the DCM to reacquire and lock to the PCLK input.

Figure 7:
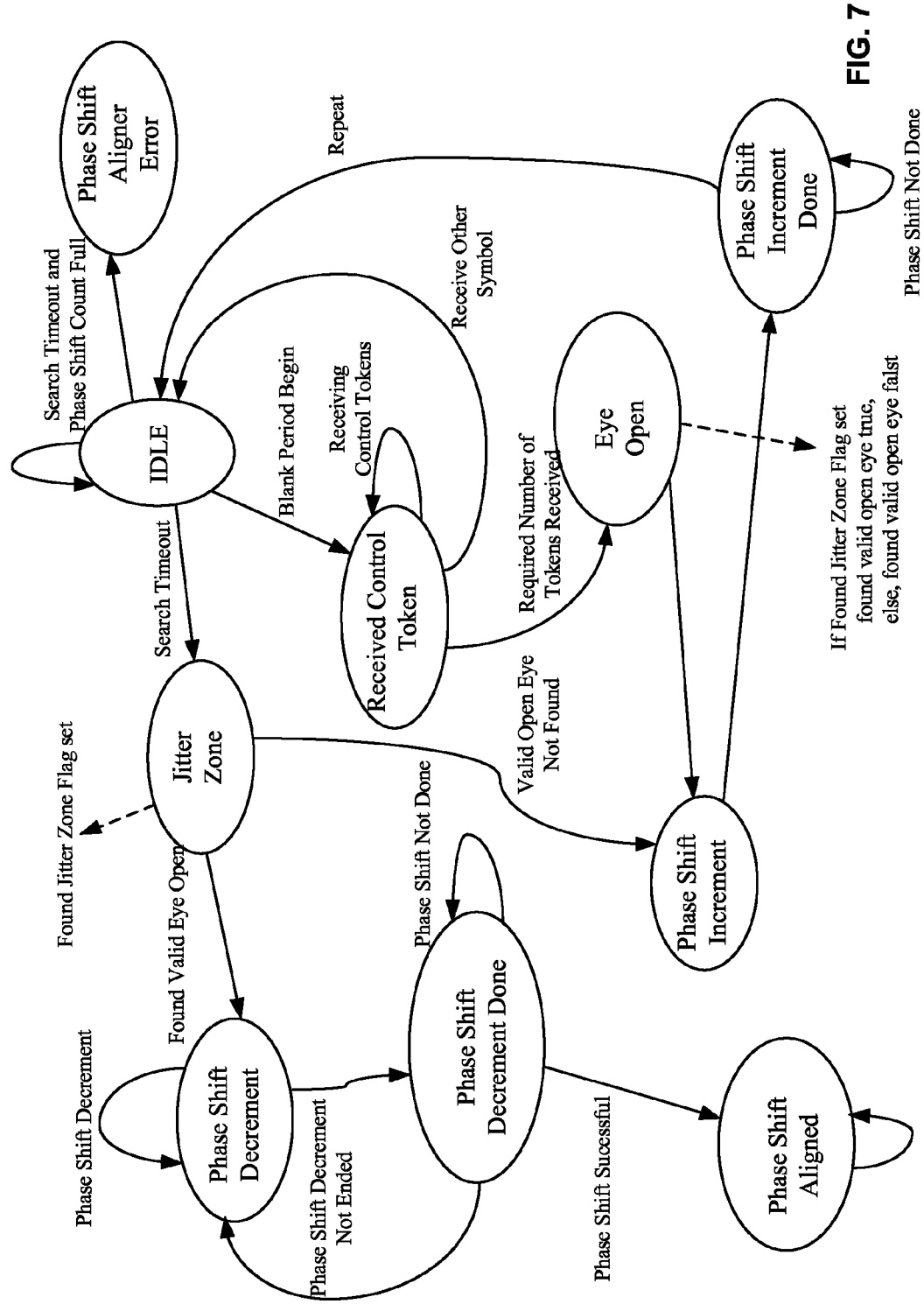
FIG. 7 is a timing diagram showing the operation of the data recovery circuit of FIG. 4 according to an embodiment of the present invention.

Turning now to FIG. 7, a timing diagram showing the operation of the data recovery circuit of FIG. 4 according to an embodiment of the present invention is shown. In order to read the video data streams, it is necessary to identify the center of the open eye of the valid data period in view of the unknown phase relationship between the reproduced clock and the data. The reproduced clock for reading data may generally be located in two locations. The clock may be positioned in the data's open eye, such as marker S1 in FIG. 5, or in the data's jitter zone, such as marker S2 in FIG. 5. The video data transmitted over the TMDS channels is essentially random, but the four distinct control tokens are periodically transmitted. The uniqueness of these tokens, which may be detected by the word boundary detection circuit, provides a basis to detect the position of the clock relative to the data. For example, the DVI Specification 1.0 requires that the minimum blanking period must be at least 128 pixels for the transmission of the control tokens, while the HDMI Specification 1.3 shrinks the control token period to 12 pixels while allowing the rest of blanking period to transmit audio or auxiliary data. Accordingly, if the appropriate number of consecutive control tokens is detected within a time limit, the clock is deemed to have arrived in the open eye position. Otherwise, the clock is deemed to have arrived in the jitter zone. By shifting the clock phase, the beginning positions of the open eye and jitter zone may be recorded. That is, marker T1 and T2 in FIG. 5 may be identified, and the middle of the open eye may be calculated to be (T2−T1)/2.

In order to determine marker T1 and marker T2 and select the correct phase of the DLL to read the data in the middle of the eye, the phase alignment unit 420 comprises a state machine which may operate according to the timing diagram of FIG. 7. In particular, in a first case, if the clock initially arrives at the marker position S2 in the jitter zone, the phase is incremented toward T1 of FIG. 5, which is recorded, and then continuously incremented until T2. After T2 is recorded, the phase is decremented back to (T2−T1)/2. In contrast, in a second case, if the clock initially arrives at the marker position S1, the current open eye is abandoned and the next eye is used. The phase is then incremented toward S2 where the next jitter zone starts. The phase is continuously incremented until T1, which is recorded, and then until T2, which is also recorded. The phase is then incremented back to (T2−T1)/2. Accordingly, in the second case when the clock is initially detected in an open eye, that open eye is ignored and the phase is incremented toward the next open eye.

While the state machine initially does not know whether first case or second case exists, the state machine will determine which case exists, as will be described in detail below. In an Idle state, the state machine determines when a blanking period begins based upon an output of the word boundary detection circuit 418, at which time the process will enter the Received Control Token state. If symbols other than control tokens are received before the required number of control tokens, the process will return to the Idle state. If the required number of control tokens is received, the process will shift to an Eye Open state, indicating that the data is being received in the open eye. Assuming that an open eye has not yet been detected when in the Open Eye state, the phase shifter increments the phase until the next open eye is identified. That is, when the clock is initially found in the open eye, it is determined that the second case exists, and the process moves to the Phase Shift Increment state and the phase is incremented until T1. As set forth above, the phase is continuously incremented until T2. Once T1 and T2 are determined, the process enters the Phase Shift Increment Done state, and the process returns to the idle state.

However, when in the idle state, if it is determined that a search timeout is reached and no control tokens are detected, it is determined that the clock was received in the jitter zone, at which time a jitter zone flag is set. As will be described further, the jitter zone flag may be used after an open eye is found. That is, if the clock is determined to be in a jitter zone and an open eye has been identified, it is determined to be a valid open eye, rather than an open eye identified in the first case which is abandoned. However, if the jitter zone flag is not set, it is determined that it is not a valid open eye (i.e. an open eye of the second case). When in the jitter zone and a valid open eye has not yet been found, the process will enter the Phase Shift Increment state. That is, the first case is determined to exist, and that phase is incremented to determine T1 and T2 as previously described. However, if a valid open eye had already been found when in the jitter zone, it is determined that it is necessary to decrement the phase to return to the middle of the eye. Accordingly, in the Phase Shift Decrement state, the phase is decremented until the middle of the eye is reached, at which time the Phase Shift Decrement Done state is reached. Accordingly, the phase shift is considered to be successful, and the process enters a Phase Shift Aligned state, where the circuit remains locked in the correct phase. If a search timeout is reached and a phase shift count is full indicating that the clock phase has been shifted the full amount, a Phase Shift Alignment Error state is entered.

Computer program listing appendices having code for implementing the various elements of FIG. 4 according to one aspect of the present invention are being filed with this application as six separate text files, the contents of which are incorporated herein by reference in their entirety. In particular, the computer code listing provides details related to aspects of the phase alignment unit. The code reproduced in these files contains material subject to copyright protection. The copyright owner of that material has no objection to the facsimile reproduction of the patent document or the patent disclosure, as it appears in the Patent and Trademark Office patent files or records, but otherwise reserves all copyright rights whatsoever.

By way of example, the circuit and methods of embodiments of the present invention may be implemented in a Xilinx Spartan 3A from Xilinx, Inc. of San Jose, Calif. A Spartan 3A device provides a typical phase shift range of a DCM in number of steps comprising ±[INTEGER (15· (TCLKIN−3 ns))]. The TCLKIN is the pixel clock period which is approximately 13 ns. Accordingly, the DCM is capable of shifting approximately ±150 steps for a total of 300 steps. Each step is averaged between 15 ps to 35 ps. The actual phase shift range is from 15×300=4500 ps (4.5 ns) to 35×300=10500 ps (10.5 ns). Therefore, the two UIs in the HD video, 1.3+1.3=2.6 ns, is well covered, and TMDS HD video reception is feasible in a single integrated circuit such as an FPGA.

Figure 8:
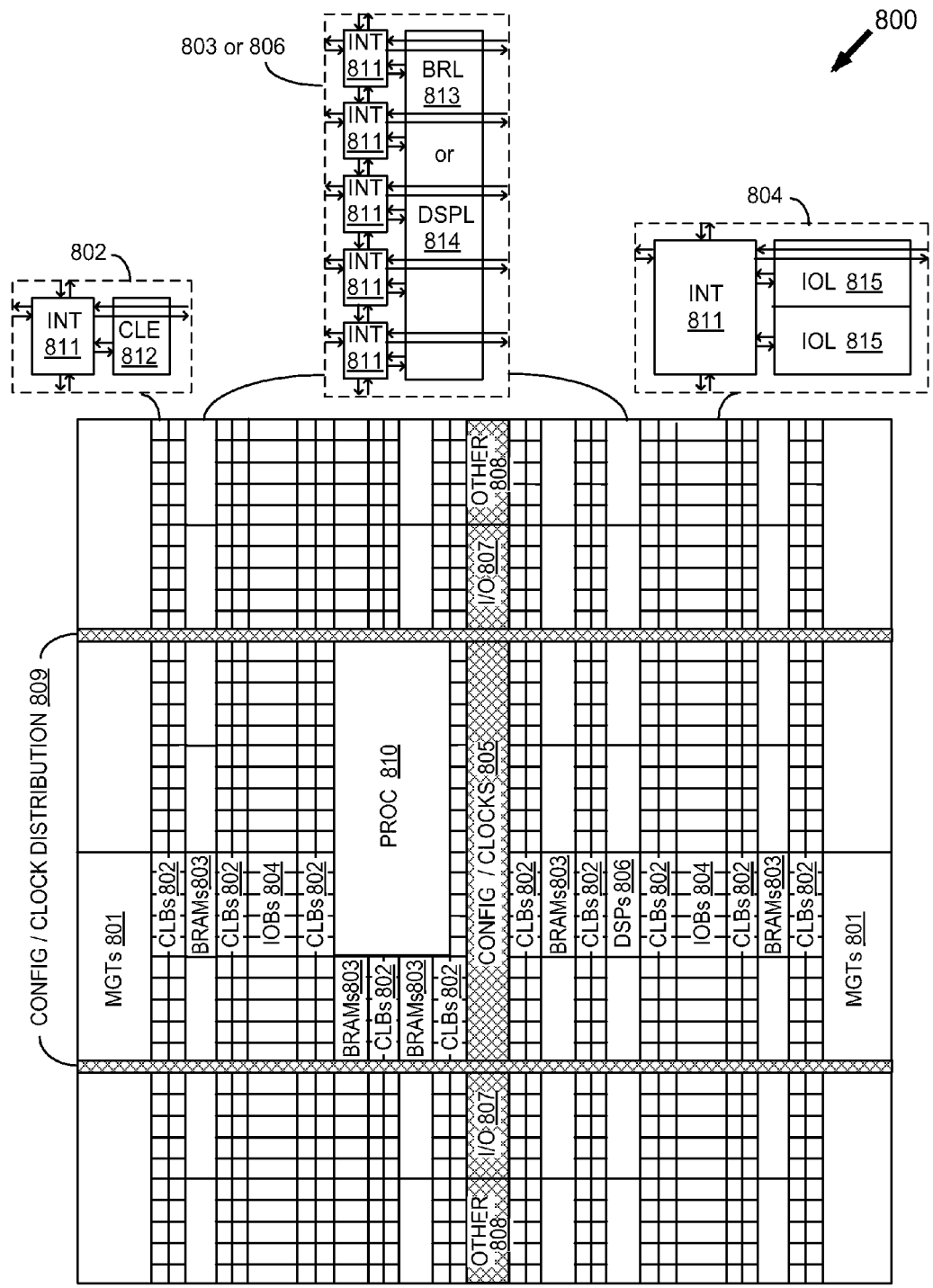
FIG. 8 is a block diagram of a programmable logic device according to an embodiment of the present invention.

Turning now to FIG. 8, a block diagram of a programmable logic device according to an embodiment of the present invention is shown. The FPGA architecture 800 of FIG. 8 includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. The digital clock managers may be configured using programmable interconnects and I/Os to receive the pixel clock and pixel data as described above. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 612) that may be programmed to implement user logic plus a single programmable interconnect element (INT 811). A BRAM 803 may include a BRAM logic element (BRL 813) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811).

In the pictured embodiment, a columnar area near the center of the die (shown crosshatched in FIG. 8) is used for configuration, clock, and other control logic. Horizontal areas 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 9:
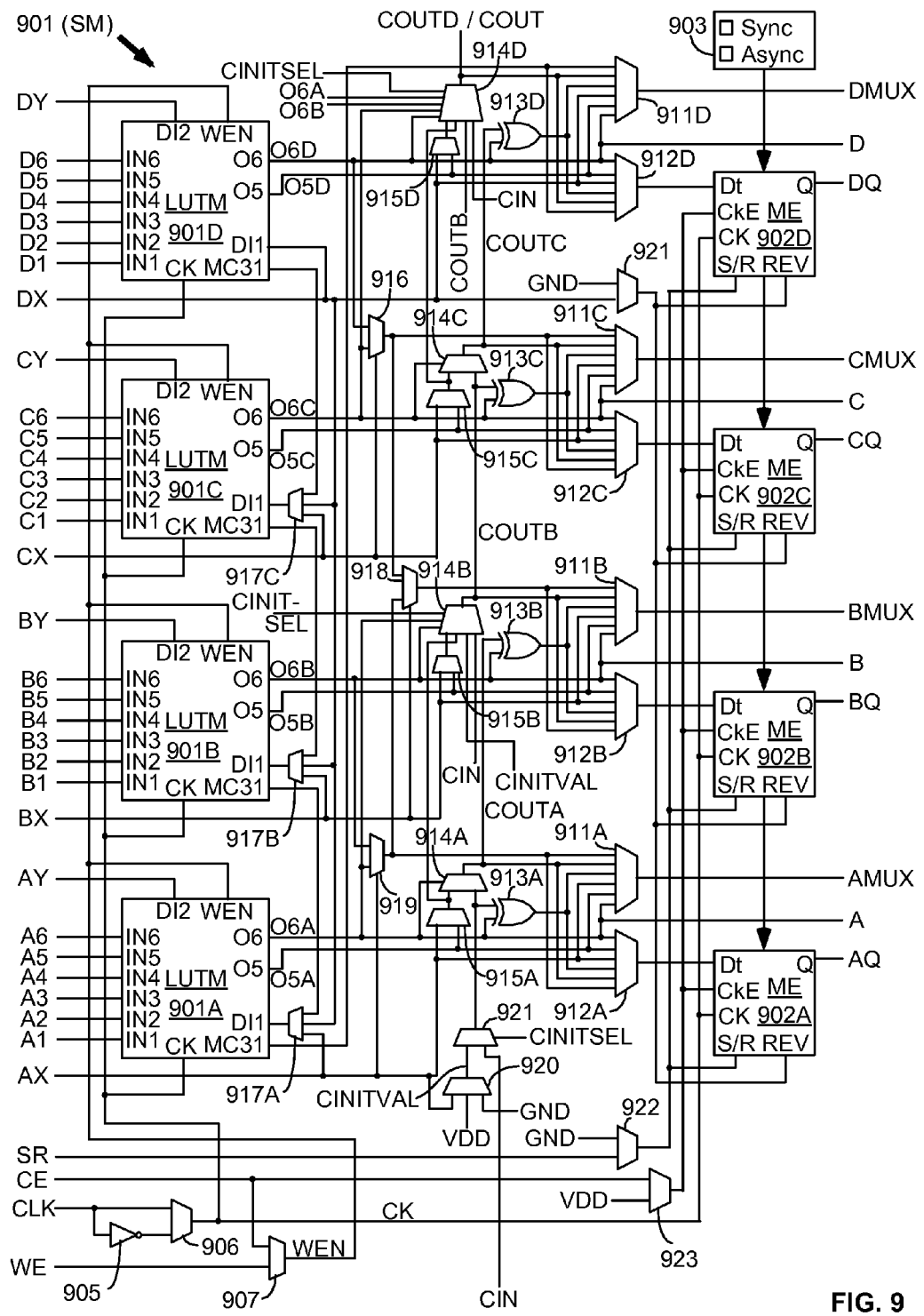
FIG. 9 is a block diagram of a configurable logic element of the programmable logic device of FIG. 8 according to an embodiment of the present invention.

Turning now to FIG. 9, a block diagram of a configurable logic element of the programmable logic device of FIG. 8 according to an embodiment of the present invention is shown. In particular, FIG. 9 illustrates in simplified form a configurable logic element of a configuration logic block 802 of FIG. 8. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 902 coupled to a multiplexer 904. In particular, the LUT 902 receives 4 input signals which are decoded to generate an output D1 associated with data stored in the LUT at the address designated by the input signals. The multiplexer 904 is adapted to receive the output of LUT 902 and a registered value of Reg_DI_. The output of the multiplexer 904 is coupled to a register 906 which generates an output Q1.

A Write Control Circuit 908 is coupled to receive RAM control signals and generate signals to control the LUT 902. In addition to a data input (DI) coupled to receive DI_1 and conventional read and write control signals coupled to a read enable input (R) and a write enable input (W), respectively, the LUT 902 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 910 coupled to a multiplexer 912. The LUT 910 is adapted to receive input signals IN4-IN7, while the multiplexer 912 is coupled to receive the output D2 of the LUT 910 and the registered input value Reg_DI_2. The output of the multiplexer 912 is coupled to a register 714 which generates an output Q2. The write control circuit 908 also generates a partial reset signal and an initial state signal for selectively resetting or setting one or more of the bits of the LUT 910.

Similarly, slice 2 comprises a function generator implemented as a LUT 922 coupled to a multiplexer 924. The LUT 922 is adapted to receive input signals IN8-IN11, while the multiplexer 924 is coupled to receive the output of the LUT 922 and a registered input value Reg_DI_3. The output of the multiplexer 924 is coupled to a register 926 which generates an output Q3. A Write Control Circuit 928 is coupled to receive RAM control signals and generate signals to control the LUT 922. In particular, input signals IN8-IN11 are decoded to generate an output D3 associated with data stored in the LUT at the address designated by the input signals. The LUT 922 comprises a partial reset input (RST) for receiving a partial reset signal, and an initial state input (IS) for receiving an initial state signal. Similarly, slice 2 comprises a function generator implemented as a LUT 930 coupled to a multiplexer 932. The LUT 930 is adapted to receive input signals IN12-IN15, while the multiplexer 932 is coupled to receive the output D4 of the LUT 930 and a registered input value Reg_DI_4. The output of the multiplexer 932 is coupled to a register 934 which generates an output Q4. The write control circuit 928 also generates a partial reset signal and an initial state signal for selectively resetting or setting one or more of the bits of the LUT 930.

Figure 10:
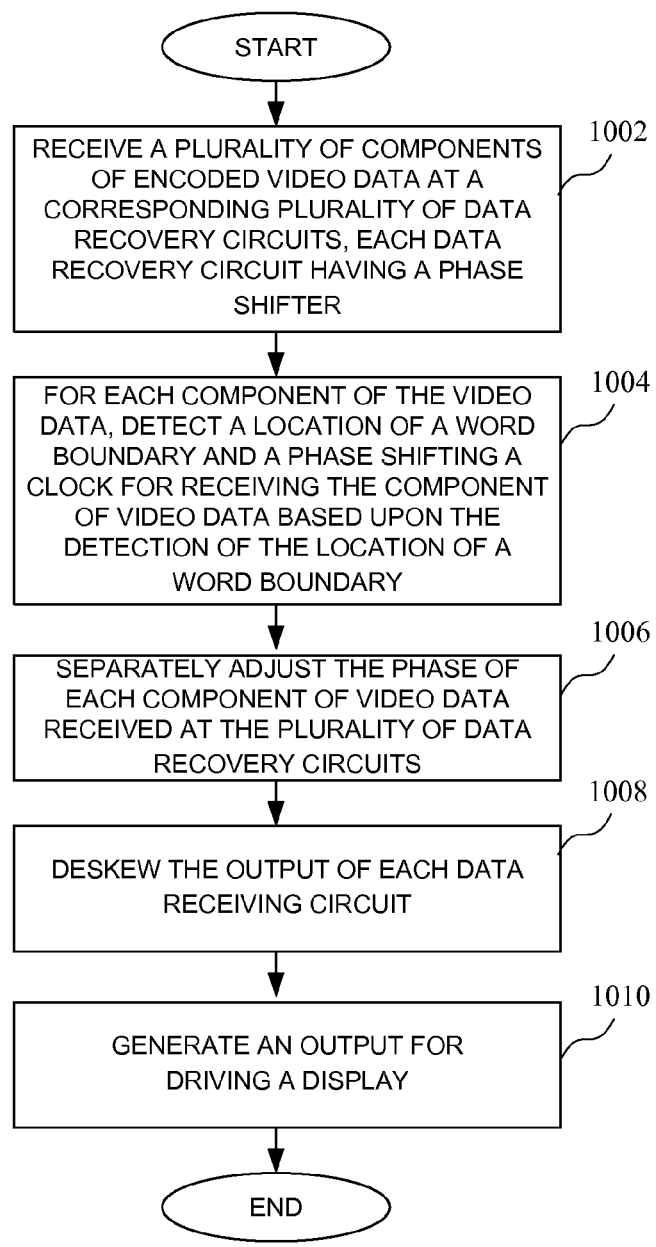
FIG. 10 is a flow chart showing a method of receiving video data according to an embodiment the present invention.

Finally, turning to FIG. 10, a flow chart shows a method of receiving video data according to an embodiment the present invention. In particular, a plurality of components of encoded video data is received at a corresponding plurality of data recovery circuits at a step 1002, where each data recovery circuit has a phase shifter. For each component of the video data, a location of a word boundary are detected and a clock for receiving the component of video data is phase shifted based upon the detection of the location of a word boundary at a step 1004. The phase of each component of video data received at the plurality of data recovery circuits is separately adjusted at a step 1006. The output of each data receiving circuit is deskewed to align the plurality of components of video data at a step 1008. An output for driving a display is then generated at a step 1010. The method of FIG. 10 may be implemented according to any of the embodiments as shown and described in reference to FIGS. 1-9, or using other suitable circuits.

The circuits and methods of the present invention enable reliably recovering an incoming HD video data stream in a single integrated circuit. While the methods and circuit are particularly beneficial in programmable logic devices, they may be implemented in other types of circuits including Application Specific Integrated Circuits (ASICs). According to one benefit of the invention, the circuits and methods enable the reception of TMDS HD video data without using any external third party devices, and provide data recovery without the use of a precise PLL in order to conduct oversampling technique. By using a DLL per channel instead of a single PLL and leveraging the DLL's variable phase shift capability to dynamically adjust the clock into the middle of the data eye of each channel, the circuit and methods reduce the cost of implementing a video receiver. The circuits and methods may also apply a DDR technique to use a 5× instead of 10× bit sampling clock in order to make it easier to physically implement the data receiver in a low cost device.

It can therefore be appreciated that the new and novel circuit for and method of receiving video data has been described. It will be appreciated by those skilled in the art that numerous alternatives and equivalents will be seen to exist which incorporate the disclosed invention. As a result, the invention is not to be limited by the foregoing descriptions of embodiments, but only by the following claims.

What is claimed is:

1. A circuit of an integrated circuit for receiving video data having a plurality of data streams of pixel data and a pixel clock, the circuit comprising:
   a plurality of data recovery circuits, each data recovery circuit coupled to receive a corresponding data stream of the plurality of data streams and having a phase shifter which shifts the phase of a bit rate sample clock signal with respect to the pixel clock by a fraction of the pixel clock, wherein the bit rate sample clock signal is used to receive the corresponding data stream;
   wherein each data recovery circuit comprises a word boundary detection circuit coupled to receive data of the corresponding data stream, the word boundary detection circuit enabling a selection of a phase of the bit rate sample clock signal used to receive the corresponding data stream to align to a bit of the corresponding data stream; and
   a channel deskew circuit coupled to receive an output of each data recovery circuit and the pixel clock.

2. The circuit of claim 1 wherein each data recovery circuit of the plurality of data recovery circuits is also coupled to receive the pixel clock.

3. The circuit of claim 1 wherein the phase shifter of each data recovery circuit of the plurality of data recovery circuits comprises a delay-locked loop.

4. The circuit of claim 1 further comprising, for each data recovery circuit, a phase alignment state machine coupled to the word boundary detection circuit, wherein the phase alignment state machine controls the phase shifter to adjust the phase of the clock signal used to receive the corresponding data stream.

5. The circuit of claim 4 wherein the plurality of data streams comprises encoded data, the circuit further comprising a decoder coupled to the output of the channel deskew circuit to decode the encoded data.

6. The circuit of claim 1 wherein the integrated circuit comprises a programmable logic device.

7. A circuit of an integrated circuit for receiving video data having a plurality of data streams of pixel data and a pixel clock, the circuit comprising:
- a first data recovery circuit having a first phase shifter enabling shifting a first bit rate sample clock signal in phase with respect to the pixel clock by a fraction of the pixel clock, the first data recovery circuit receiving signals associated with a red component of the video data;
- wherein the first data recovery circuit comprises a first word boundary detection circuit coupled to receive the red component of the video data, the first word boundary detection circuit enabling a selection of a phase of the first bit rate sample clock signal for recovering the red component of the video data to align to a bit of the red component of the video data;
- a second data recovery circuit having a second phase shifter enabling shifting a second bit rate sample clock signal in phase with respect to the pixel clock by a fraction of the pixel clock, the second data recovery circuit receiving signals associated with a green component of the video data;
- wherein the second data recovery circuit comprises a second word boundary detection circuit coupled to receive the green component of the video data, the second word boundary detection circuit enabling a selection of a phase of the second bit rate sample clock signal for recovering the green component of the video data to align to a bit of the green component of the video data;
- a third data recovery circuit having a third phase shifter enabling shifting a third bit rate sample clock signal in phase with respect to the pixel clock by a fraction of the pixel clock, the third data recovery circuit receiving signals associated with a blue component of the video data;
- wherein the third data recovery circuit comprises a third word boundary detection circuit coupled to receive the blue component of the video data, the third word boundary detection circuit enabling a selection of a phase of the third bit rate sample clock signal for recovering the blue component of the video data to align to a bit of the blue component of the video data; and
- a channel deskew circuit coupled to receive an output of each of the first, second and third data recovery circuits and the pixel clock.

8. The circuit of claim 7 wherein the video data comprises encoded data, the circuit further comprising a decoder coupled to the output of the channel deskew circuit for decoding the red, blue and green components of the video data.

9. The circuit of claim 7 further comprising, for each data recovery circuit, a phase alignment state machine coupled to the word boundary detection circuit, wherein the phase alignment state machine controls the phase of a clock signal for recovering a component of the data.

10. The circuit of claim 9 wherein the phase of a clock signal for recovering a component of the data is controlled based upon the detection of control tokens by a word boundary detection circuit.

11. The circuit of claim 7 wherein the phase shifters of the first, second and third data recovery circuits comprises delay-locked loops.

12. The circuit of claim 11 wherein the first, second and third data recovery circuits each further comprise a double data rate circuit coupled to receive pixel data.

13. A method of receiving video data having a plurality of data streams of pixel data and a pixel clock, the method comprising:
- receiving a plurality of components of the video data at a corresponding plurality of data recovery circuits, each data recovery circuit having a phase shifter which enables shifting a bit rate sample clock signal in phase with respect to the pixel clock by a fraction of the pixel clock, and a word boundary detection circuit coupled to receive a corresponding component of the video data, the word boundary detection circuit enabling a selection of a phase of the bit rate sample clock signal to align to a bit of the corresponding component of the video data;
- separately adjusting, for each component of video data received at the plurality of data recovery circuits, the phase of the bit rate sample clock signal to align to a bit of the corresponding component of the video data; and
- deskewing the output of each data recovery circuit of the plurality of data recovery circuits.

14. The method of claim 13 wherein receiving a plurality of components of the video data at a plurality of data recovery circuits comprises receiving pixel data for each color component at a separate data recovery circuit.

15. The method of claim 13 wherein receiving a plurality of components of the video data comprises receiving encoded data, the method further comprising decoding the encoded data.

16. The method of claim 13 further comprising, for each component of the video data, detecting a location of control tokens and phase shifting the bit rate sample clock signal with respect to the pixel clock for receiving the corresponding component of the video data based upon the detection of the location of the control tokens.

17. The method of claim 16 wherein separately adjusting, for each component of the video data received at the plurality of data recovery circuits, the phase of the bit rate sample clock signal comprises adjusting the phase of the bit rate sample clock signal for reading the video data to the center of an eye of a valid data period.

18. The method of claim 13 further comprising generating an output for driving a display.

* * * * *